United States Patent
Jang et al.

(10) Patent No.: US 7,564,085 B2
(45) Date of Patent: Jul. 21, 2009

(54) MECHANICAL MEMORY DEVICE AND METHOD OF MANUFACTURING THE SAME

(75) Inventors: Jae-Eun Jang, Seoul (KR); Seung-Nam Cha, Seoul (KR); Byong-Gwon Song, Seoul (KR); Yong-Wan Jin, Seoul (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 160 days.

(21) Appl. No.: 11/606,966

(22) Filed: Dec. 1, 2006

(65) Prior Publication Data

US 2007/0138525 A1    Jun. 21, 2007

(30) Foreign Application Priority Data

Dec. 2, 2005    (JP)    ............ 10-2005-0116891

(51) Int. Cl.
*H01L 27/108*    (2006.01)
*H01L 29/08*    (2006.01)

(52) U.S. Cl. ............ 257/296; 257/315; 977/724; 977/725

(58) Field of Classification Search ............ 257/296, 257/315; 977/724, 725, 732
See application file for complete search history.

(56) References Cited

U.S. PATENT DOCUMENTS

2004/0253805 A1*    12/2004    Dubin et al. ............ 438/618
2005/0064185 A1*    3/2005    Buretea et al. ............ 428/364
2006/0011972 A1*    1/2006    Graham et al. ............ 257/324
2006/0071334 A1*    4/2006    Kawabata et al. ............ 257/741

FOREIGN PATENT DOCUMENTS

EP    1724785 A1 *    11/2006

* cited by examiner

*Primary Examiner*—Anh Phung
*Assistant Examiner*—Allison P Bernstein
(74) *Attorney, Agent, or Firm*—Robert E. Bushnell, Esq.

(57) ABSTRACT

A memory device that performs writing and reading operations using a mechanical movement of a nanowire, and a method of manufacturing the memory device are provided. The memory device includes a source electrode, a drain electrode, and a gate electrode, each of which is formed on an insulating substrate. A nanowire capacitor is formed on the source electrode. The nanowire capacitor includes a first nanowire vertically grown from the source electrode, a dielectric layer formed on the outer surface of the first nanowire, and a floating electrode formed on the outer surface of the dielectric layer. A second nanowire is vertically grown on the drain electrode. The drain electrode is arranged between the source electrode and the gate electrode. The second nanowire is elastically deformed and contacts the nanowire capacitor when a drain voltage is applied to the drain electrode, and polarity of the drain voltage is opposite to polarity of a source voltage that is applied to the source electrode. Information is stored in the memory device in a form of a charged or non-charged state of the nanowire capacitor. Reading and writing operation of the memory device is performed by the mechanical movement of the second nanowire.

10 Claims, 10 Drawing Sheets

MECHANICAL MEMORY DEVICE AND METHOD OF MANUFACTURING THE SAME

CLAIM OF PRIORITY

This application makes reference to, incorporates the same herein, and claims all benefits accruing under 35 U.S.C. §119 from an application for MECHANICAL MEMORY DEVICE AND FABRICATION METHOD OF THE SAME earlier filed in the Korean Intellectual Property Office on the 2 Dec. 2005 and there duly assigned Serial No. 10-2005-0116891.

BACKGROUND OF THE INVENTION

1. Field of the Invention

The present invention relates to a memory device, and more particularly, to a memory device that manipulates a mechanical movement of a nanowire and has superior and stable writing capabilities, and a method of manufacturing the same.

2. Description of the Related Art

A dynamic random access memory (DRAM) is a widely used semiconductor memory device, and has a unit memory cell including one transistor and one capacitor. To increase the integration density of the DRAM device, the volume of the transistor and/or the capacitor must be reduced. However, there is a limit to the reduction of the volume of the memory device, due to the structure and manufacturing process of the DRAM device.

Demands for more highly integrated semiconductor memory devices require development of a new semiconductor memory device structure which allows higher integration densities. To meet this requirement, memory devices with new structures have been developed. The new memory devices include different data storage media which operate on different principles from conventional capacitors.

For example, DRAM and flash memory devices store binary information as electric charge. However, recent non-volatile memory devices, such as ferroelectric random access memory (FRAM), magnetic random access memory (MRAM), and phase-change random access memory (PRAM) devices, store binary information using a resistance material. A FRAM device uses polarization of a ferroelectric material, a MRAM device uses a magnetic tunnel junction (MTJ) thin film whose resistance changes according to a change of magnetization state of a ferroelectric material, and a PRAM device uses a phase change. Particularly, the FRAM, MRAM, and PRAM devices have both characteristics of the high integration of the DRAM and the non-volatility of the flash memory. Therefore, they are expected to replace the conventional non-volatile memory devices.

SUMMARY OF THE INVENTION

The present invention provides a memory device and a method of manufacturing the same. The memory device of the present invention manipulates a mechanical movement of a nanowire for a reading and writing operations, and has superior and stable writing capabilities.

According to an aspect of the present invention, there is provided a memory device including an insulating substrate, a source electrode and a drain electrode formed on the insulating substrate and spaced apart from each other, a nanowire capacitor formed on the source electrode, a second nanowire grown vertically on the drain electrode, and a gate electrode formed on the insulating substrate where the drain electrode is arranged between the source electrode and the gate electrode. The nanowire capacitor includes a first nanowire grown vertically from the source electrode, a dielectric layer formed on the outer surface of the first nanowire, and a floating electrode formed on the outer surface of the dielectric layer.

The second nanowire is elastically deformed and contacts the nanowire capacitor when a source voltage is applied to the source electrode, a drain voltage is applied to the drain electrode, and polarity of the drain voltage is opposite to polarity of a source voltage. At the same time, a gate voltage also can be applied to the gate electrode with polarity of the gate voltage being the same as the polarity of the drain voltage. The elastic deformation of the second nanowire is induced by electrostatic force applied between the first and second nanowires and between the second nanowire and the gate electrode. When there is no voltage applying to the electrodes, the second nanowire is released to its original position by elastic restoration force.

Each of the first and second nanowires may be made of a material such as a carbon group material, a platinum group material, a silicon group material, a gallium nitride group material, a gallium arsenide group material, or a zinc oxide group material. For example, each of the first and second nanowires may be a wire selected from the group consisting of a carbon fiber wire, a carbon nanotube wire, a platinum wire, a silicon wire, a gallium nitride wire, a gallium arsenide wire, and a zinc oxide wire.

Each of the first and second nanowires may have a height of about 1 μm to about 4 μm, and a diameter of about 5 nm to about 100 nm.

Each of the source electrode, the drain electrode, the gate electrode, and the floating electrode may be made of a material such as niobium, chromium, molybdenum, tungsten, titanium, platinum, gold, indium-tin-oxide, or silver.

The memory device may further includes a third nanowire grown vertically on the gate electrode. The third nanowire may be made of a material such as a carbon group material, a platinum group material, a silicon group material, a gallium nitride group material, a gallium arsenide group material, or a zinc oxide group material.

According to an aspect of the present invention, there is provided a method of manufacturing a memory device, including steps of preparing an insulating substrate, forming an electrode layer on the insulating substrate, patterning the electrode layer to make a source electrode, a drain electrode, and a gate electrode spaced apart from each other in a row, vertically growing a first and second nanowires on the source electrode and the drain electrode, respectively, forming a dielectric layer on the outer surface of the first nanowire, and forming a floating electrode on the outer surface of the dielectric layer.

The method may further includes a step of growing a third nanowire on the gate electrode by the use of a material selected from the group consisting of a carbon group material, a platinum group material, a silicon group material, a gallium nitride group material, a gallium arsenide group material, and a zinc oxide group material.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components.

DETAILED DESCRIPTION OF THE INVENTION

Figure 1:
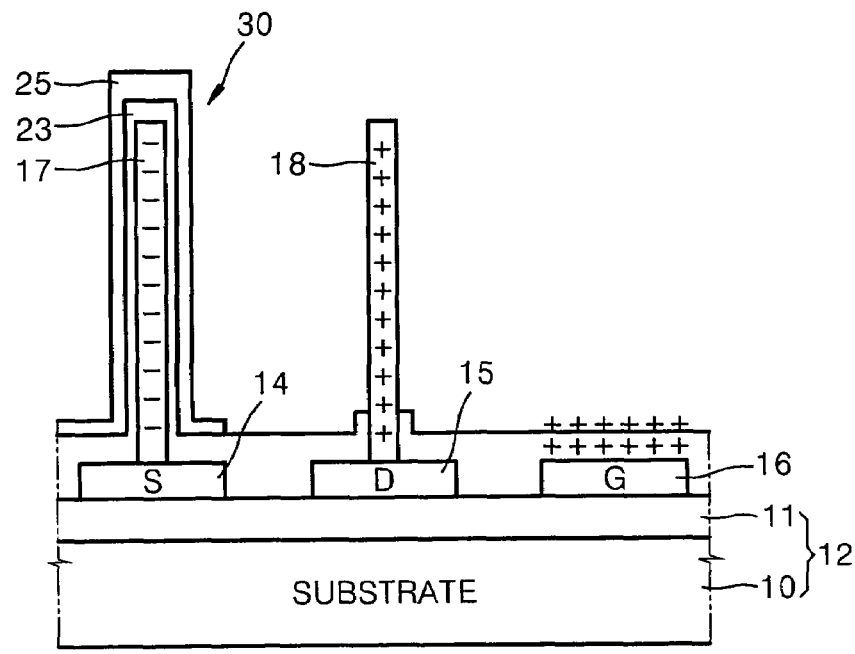
FIG. 1 is a cross-sectional view of a memory device constructed as an embodiment of the present invention.

The present invention will now be described more completely with reference to the accompanying drawings, in which exemplary embodiments of the invention are shown. In the drawings, the thicknesses of layers and regions are exaggerated for clarity.

FIG. 1 is a cross-sectional view of a memory device constructed as an embodiment of the present invention. Referring to FIG. 1, the memory device of an embodiment of the present invention includes insulating substrate 12, nanowire capacitor 30 which is a charge storage medium, and second nanowire 18 which is mechanically switched by contacting or not contacting nanowire capacitor 30. Insulating substrate 12 can be a glass substrate, a plastic substrate, or another type of insulation substrate. For example, insulating substrate 12 can include silicon (Si) substrate 10 and silicon oxide ($SiO_2$) insulating layer 11 formed on Si substrate 10.

The structure of the memory device of the present invention includes source electrode 14, drain electrode 15, and gate electrode G 16 sequentially and separately disposed in a row on insulating substrate 12. Nanowire capacitor 30 is formed on source electrode 14, and includes first nanowire 17 grown vertically on source electrode 14, dielectric layer 23 formed on an outer surface of first nanowire 17, and floating electrode 25 formed on an outer surface of dielectric layer 23. Herein, a vertically grown nanowire refers to a nanowire that grows substantially perpendicular to a plate of an electrode as shown in FIG. 1. The angle between the nanowire and the plate of the electrode, however, does not have to be a right angle. A source voltage $V_1$ is applied to first nanowire 17. In the present embodiment, each of electrodes 14, 15, 16, and 25 is made of a material such as niobium (Nb), chromium (Cr), molybdenum (Mo), tungsten (W), titanium (Ti), platinum (Pt), gold (Au), indium-tin-oxide (ITO), or silver (Ag).

Second nanowire 18 is grown vertically on drain electrode 15, and a drain voltage $V_2$, polarity of which is opposite to the polarity of the voltage $V_1$, is applied to second nanowire 18. Gate electrode 16 is located beside drain electrode 15 and formed on insulating substrate 12. A gate voltage $V_3$, which is applied to gate electrode 16, has the same polarity as the polarity of the voltage $V_2$.

Each of first and second nanowires 17 and 18 can be made of a material such as a carbon group material, a platinum (Pt) group material, a silicon (Si) group material, a gallium nitride (GaN) group material, a gallium arsenide (GaAs) group material, or a zinc oxide (ZnO) group material. For example, each of first and second nanowires 17 and 18 can be a wire such as a carbon fiber wire, a carbon nanotube (CNT) wire, a platinum (Pt) wire, a silicon (Si) wire, a gallium nitride (GaN) wire, a gallium arsenide (GaAs) wire, or a zinc oxide (ZnO) wire. Each of dielectric layer 23 and floating electrode 25 can be formed to a thickness of about 5 nm to about 100 nm.

In the memory device having the above structure of the embodiment of the present invention, when voltages $V_1$, $V_2$, and $V_3$ are applied to first nanowire 17, second nanowire 18, and gate electrode 16, respectively, an electrostatic force is generated between first and second nanowires 17 and 18, and between second nanowire 18 and gate electrode 16. An attractive force is generated between first and second nanowires 17 and 18, and a repulsive force is generated between second nanowire 18 and gate electrode 16. Accordingly, second nanowire 18 is elastically deformed due to the electrostatic force to contact nanowire capacitor 30, and the memory device is switched on. When one of the voltages $V_1$, $V_2$, and $V_3$ is turned off, second nanowire 18 returns to its original position by an elastic restoration force, and the memory device is switched off. Accordingly, the on and off states of the memory device, driven by contact or non-contact between second nanowire 18 and nanowire capacitor 30, can be controlled by individually controlling the voltages $V_1$, $V_2$, and $V_3$. Switching the memory device on and off allows data to be written to or read from nanowire capacitor 30.

The memory device having the above structure is a new type of a mechanical memory device that can replace a DRAM device. A mechanical memory device of the present invention has stable switching characteristics and minimal leakage current, because the mechanical memory device provides clear on and off states by using the mechanical movement of a nanowire. Accordingly, the driving voltage of the memory device can be reduced, and mobility of the memory device is higher than that of a DRAM device.

Figure 2A:
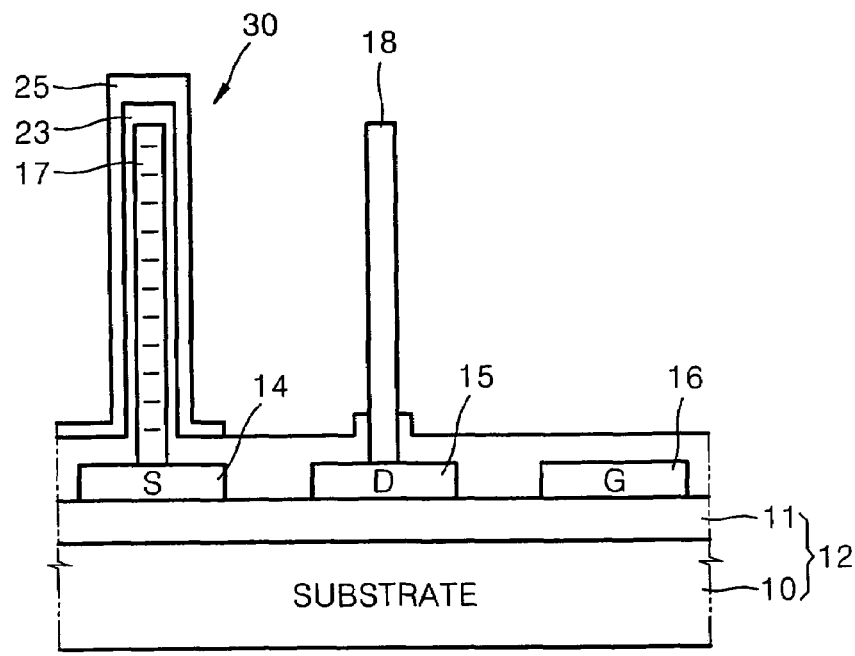
FIGS. 2A through 2D are cross-sectional views showing a writing and reading operations of the memory device of FIG. 1 of an embodiment of the present invention.
Figure 2B:
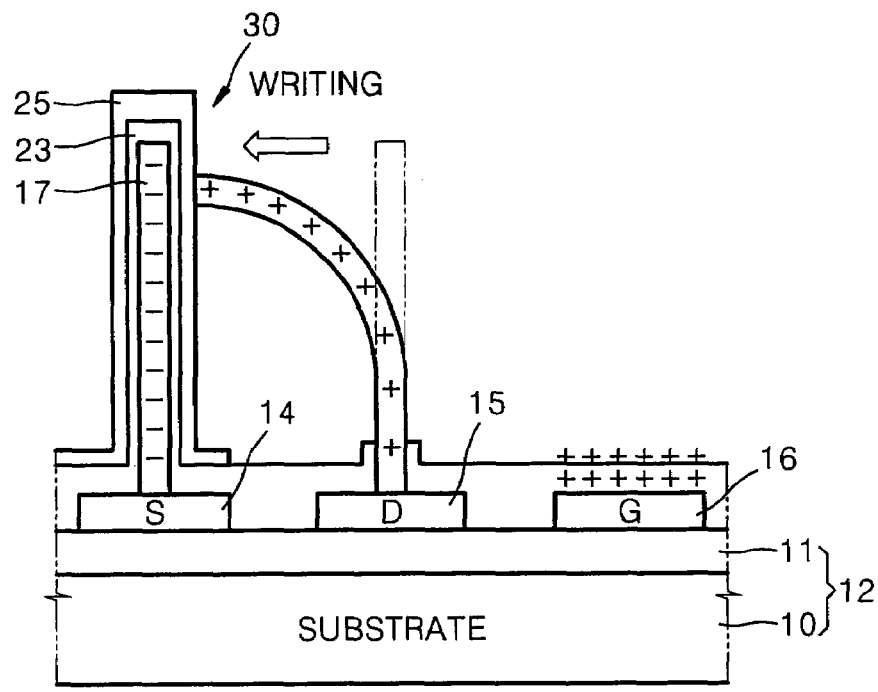

Operations of writing and reading data in a memory device of the present invention will now be described in detail with reference to the drawings. FIGS. 2A through 2D are cross-sectional views showing operations of writing and reading data in the memory device of FIG. 1, which is built as an embodiment of the present invention. Referring to FIGS. 2A and 2B, when voltages $V_1$(−, negative polarity), $V_2$(+, positive polarity), and $V_3$(+, positive polarity) are applied to first nanowire 17, second nanowire 18, and gate electrode 16, respectively, second nanowire 18 elastically bends and contacts nanowire capacitor 30 due to an electrostatic force applied to second nanowire, and the memory device becomes an ON state. As a result, charge is transferred to and stored in nanowire capacitor 30.

Figure 2C:
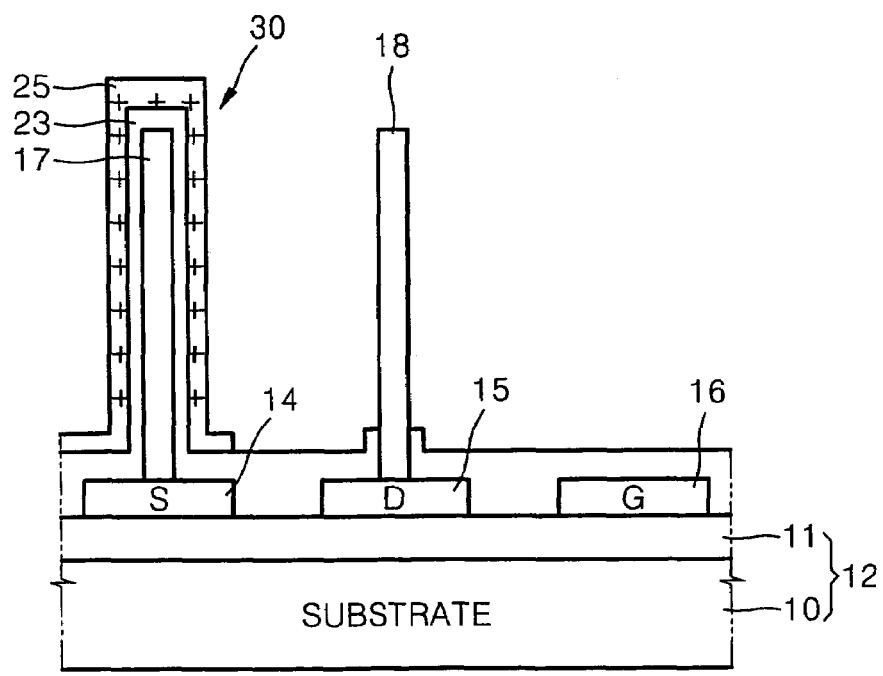

Referring to FIG. 2C, when the voltages $V_2$ and $V_3$ are removed from second nanowire 18 and gate electrode 16, respectively, second nanowire 18 returns to its original position due to the restoration force, and nanowire capacitor 30 remains charged, which is a state that stores information ("1" state).

Figure 2D:
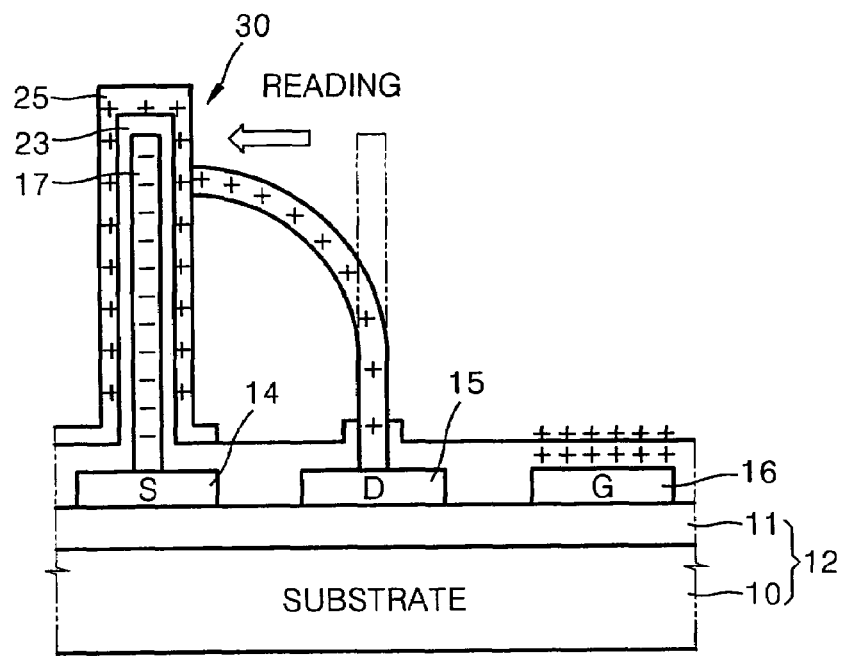

FIG. 2D shows a reading mechanism of the memory device of the embodiment of the present invention. The state of nanowire capacitor 30 can be read by applying a voltages $V_1$(−), $V_2$(+), and $V_3$(+) again to first nanowire 17, second nanowires 18, and gate electrode 16, respectively. By a repulsive force applied between second nanowires 18 and gate electrode 16, nanowire 18 bends toward nanowire capacitor 30, and the memory device becomes ON state. Comparing the "1" state with the "0" state that does not store information, current flowing between nanowire capacitor 30 and nanowire 18 at the "1" state is different from current flowing at "0" state, because the amount of charges stored in nanowire capacitor 30 at the "1" state is different from the amount of charges of nanowire capacitor 30 at "0" state. For example, in the "1" state as shown in FIG. 2C, (+) charges are already stored in nanowire capacitor 30, and there will be almost no current when nanowire 18 with a voltage $V_2(+)$ contacts nanowire capacitor 30, because the polarities of charges of nanowire 18 and nanowire capacitor 30 are the same. On the contrary, in the "0" state, there will be high current when nanowire 18 with a voltage $V_2(+)$ contacts nanowire capacitor 30, because there is no charge in nanowire capacitor 30. Therefore, the state of nanowire capacitor 30 ("1" state or "0" state) is determined by detecting an amount of current flowing between nanowire 18 and nanowire capacitor 30 during ON state.

In FIGS. 2A-2D, nanowire 18 and floating electrode 25 are illustrated as being charged with (+) polarity, but it is apparent that nanowire 18 and floating electrode 25 can be charged with (−) polarity. In this case, the polarities of the voltages applied to the electrodes will be opposite to the polarities of the voltages described above, and "1" state is referred to a state where nanowire capacitor 30 is charged with (−) polarity.

In order to achieve the reading mechanism, there can be another methods in addition to the method described above. In one example of the methods, a refresh step is accompanied in the reading mechanism to more accurately read the information. In another example of the methods, "0" state and "1" state are differently defined, and the reading operation can be achieved without the refresh step.

In the reading mechanism referring to FIG. 2D, if floating electrode 25 has initially no charge ("0" state), charges flow into floating electrode 25 during the reading operation. If floating electrode 25 is initially charged ("1" state), very small amounts of charges flow into floating electrode 25. In order to read the state of floating electrode 25, a sensing circuitry measures the amount of charges that flow into floating electrode 25, and determines whether floating electrode is in "0" state or in "1" state. There is, however, a chance that the initial state of floating electrode is altered by the reading operation, because second nanowire 18 contacts floating electrode 25 during the reading operation. In order to accurately maintain the initial state of floating electrode 25, a refresh step can be introduced after the reading operation. If floating electrode 25 is connected to ground through a switch or a transistor, any accumulated charges of floating electrode 25, while reading "0" state, can be removed, and floating electrode 25 maintains its initial "0" state. If there is any loss of charges while reading "1" state, the refresh step also can supply necessary amount of charges to floating electrode 25 to maintain initial "1" state.

In another example of reading mechanism, "0" state is defined as a negatively charged state of floating electrode 25, and "1" state as positively charged state of floating electrode 25. Writing operation is the same as described referring to FIG. 2B. If positively charged second nanowire 18 contacts negatively charged floating electrode 25 ("0" state), The negatively charged floating electrode 25 ("0" state) is changed to positively charged state ("1" state). If there is no contact of second nanowire 18, floating electrode 25 remains in negatively charged state ("0" state). In order to read the state of floating electrode 25, second nanowire 18 is negatively charged. If floating electrode 25 is in "1" state (positively charged), negatively charged second nanowire 18 deflects to make a contact with floating electrode 25. A sensing circuit measures current flowing through second nanowire 18, and floating electrode 25 is gradually changed to a negatively charged state because of the contact with negatively charged second nanowire 18. If floating electrode 25 is in "0" state (negatively charged), negatively charged second nanowire 18 does not bend due to repulsive force applied between floating electrode 25 and second nanowire 18.

Therefore, second nanowire 18 does not contact floating electrode 25, and there is no current flowing through second nanowire 18. In both cases of reading "1" state and "0" state, floating electrode 25 returns to negatively charged state ("0" state). Therefore, another writing operation immediately follows the reading operation to restore the state of floating electrode 25.

The above described examples of methods have their own advantages and disadvantages. For examples, the method employing a refresh step would make the device system complicated and reduce the operation speed, and another method defining a negatively charged state of floating electrode 25 as "0" state would improve the system design, because this method does not require the refresh step, and would increase sensing margin due to the stored charges of floating electrode 25, but may reduce the lifetime of the device because of the permanently charged state of floating electrode 25. Therefore, the selection of the method may depend on the applications of the memory device. The methods described above are examples, and there will be various other methods to achieve the reading and writing mechanism maintaining the principles of the present invention.

Figure 3A:
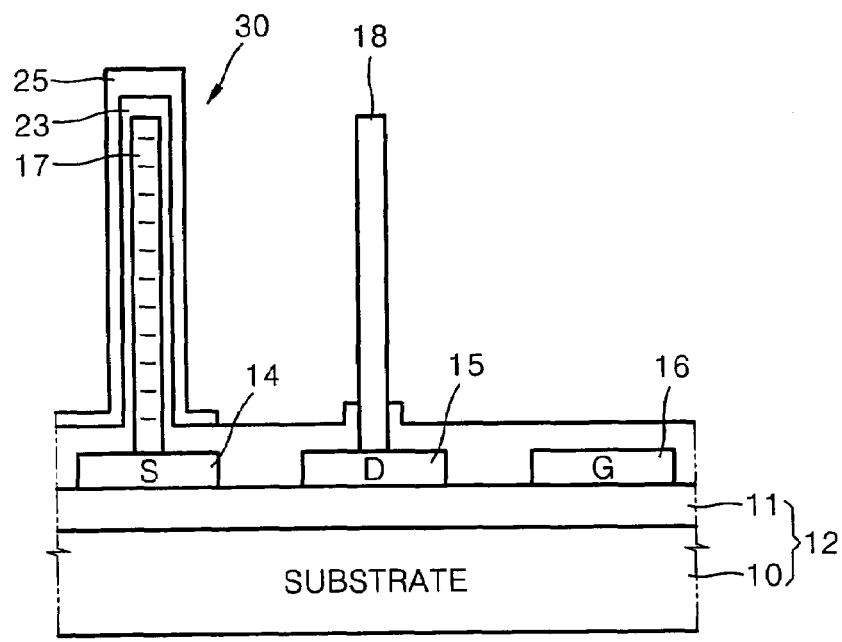
FIGS. 3A through 3D are cross-sectional views showing a writing and reading operations of the memory device of FIG. 1 of another embodiment of the present invention.
Figure 3B:
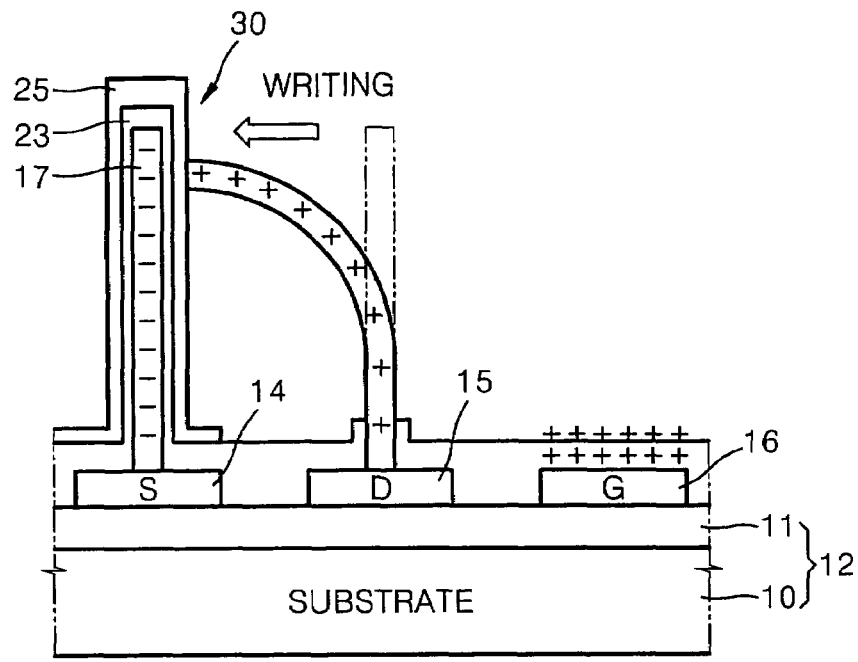
Figure 3C:
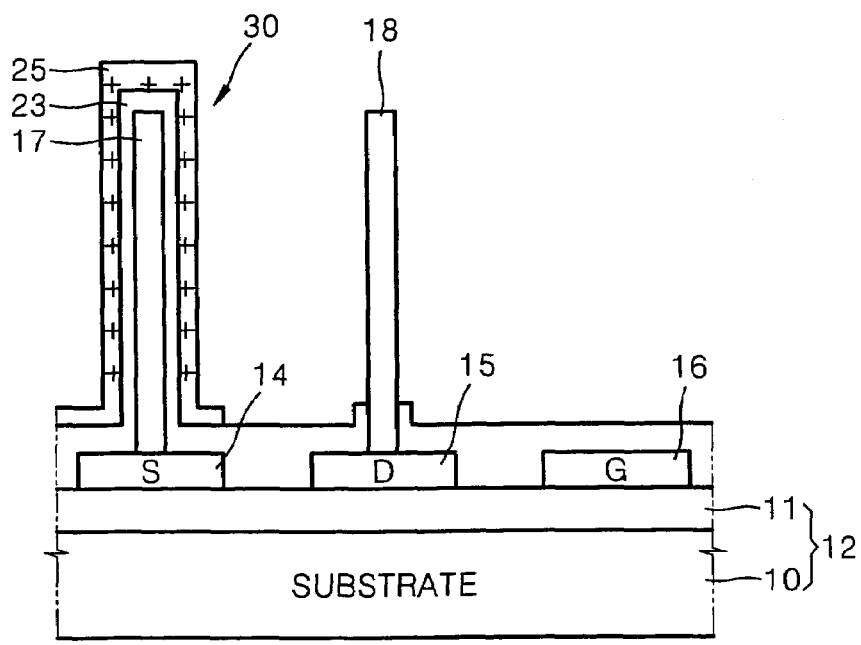

FIGS. 3A through 3D are cross-sectional views showing a writing and reading operation of the memory device of FIG. 1, constructed as another embodiment of the present invention. The principles of the operations shown in FIGS. 3A through 3C are the same as those described with reference to FIGS. 2A through 2C, and thus the descriptions will be skipped.

Figure 3D:
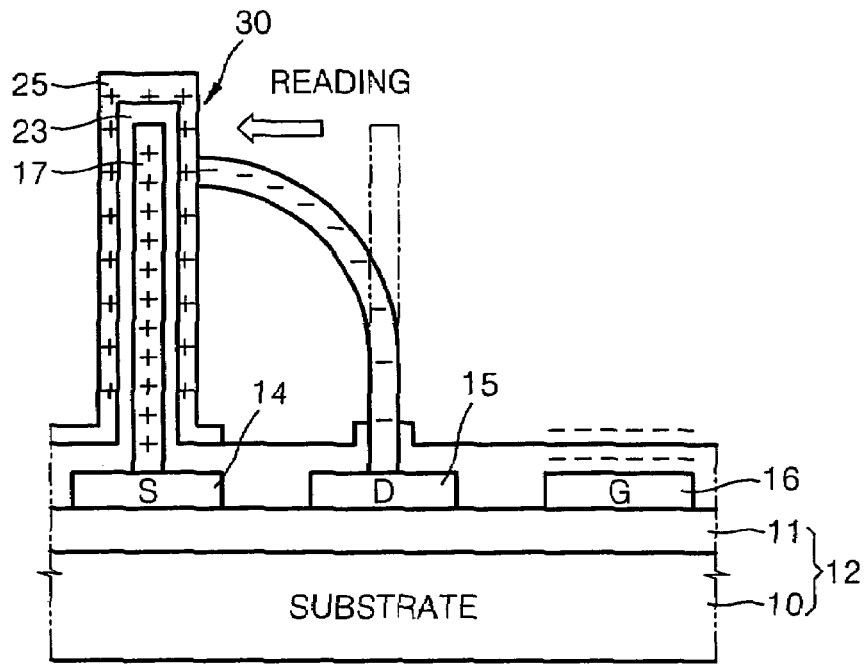

FIG. 3D shows a reading mechanism of the memory device of another embodiment of the present invention. Contrary to the reading operation shown in FIG. 2D, voltages, which have opposite polarities to the polarities of writing operation shown in FIG. 3B, are applied to first nanowire 17, second nanowires 18, and gate electrode 16. For example, voltages $V_1(+)$, $V_2(-)$, and $V_3(-)$ can be applied to first nanowire 17, second nanowires 18, and gate electrode 16, respectively, to switch the memory device to ON state. In this case, as described for reading operation shown in FIG. 2D, an amount current, which flows between nanowire capacitor 30 and second nanowire 18, at "1" state is different from an amount current at "0" state. Therefore, the state of nanowire capacitor 30 ("1" state or "0" state) can be determined by detecting an amount of current flowing between nanowire 18 and nanowire capacitor 30 during ON state. For example, in the "1" state as shown in FIG. 3C, (+) charges are stored in nanowire capacitor 30, and when nanowire 18 with a voltage $V_2(-)$ contacts nanowire capacitor 30, there will be very high current because the polarities of charges of nanowire 18 and charges of nanowire capacitor 30 are opposite. On the contrary, in the "0" state, there will be only high current when nanowire 18 with a voltage $V_2(-)$ contacts nanowire capacitor 30, but the current will be lower than the current detected at "1" state. Accordingly, whether the memory device is in "1" state or in "0" state is determined by the amount of the current.

Figure 4:
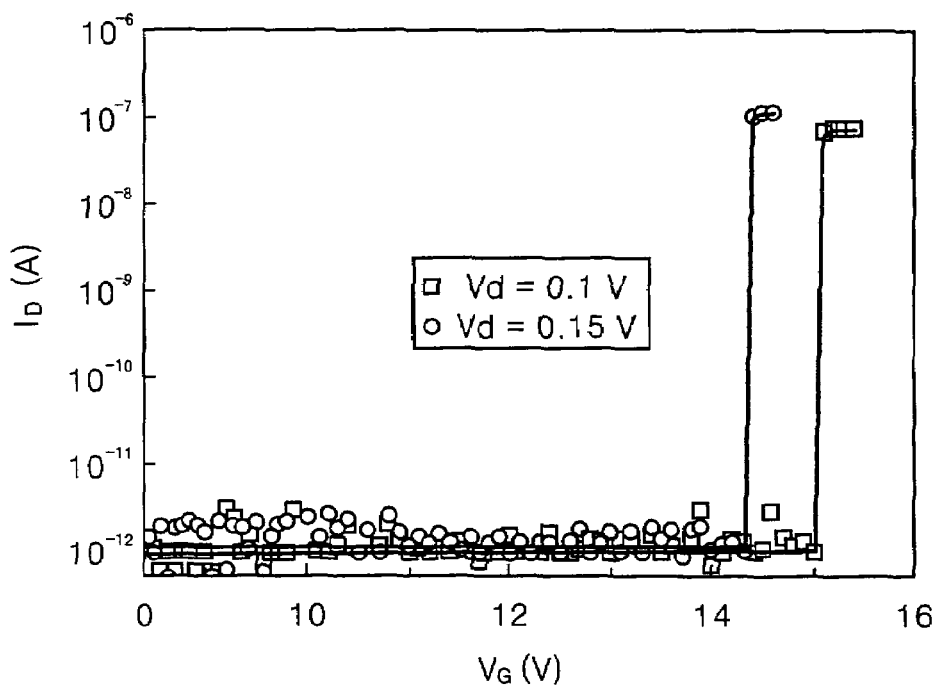
FIG. 4 is a graph showing voltage-current characteristics of an on/off operation of the memory device of FIG. 1.

FIG. 4 is a graph showing the characteristics of an ON/OFF operation of the memory device of FIG. 1. In FIG. 4, $I_D$ indicates a current flowing through drain electrode 15, and $V_G$ indicates a gate voltage applied to gate electrode 16. $V_d$ indicates a drain voltage applied to drain electrode 15. As shown in FIG. 4, the current suddenly jumps to a high level (ON state) at a certain gate voltage from a low level (OFF state). The difference in the amounts of currents at ON and OFF states is clearly distinguished. It is also observed that leakage current at OFF state is almost zero.

Figure 5:
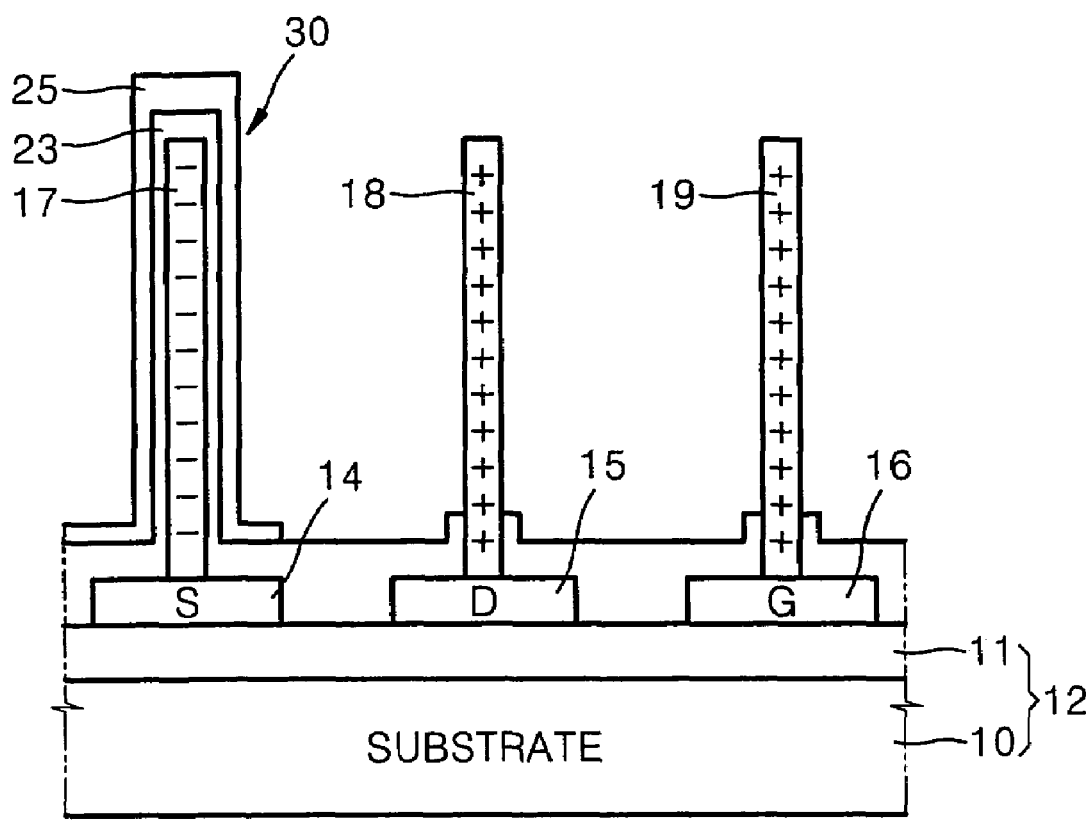
FIG. 5 is a cross-sectional view of a memory device of another embodiment of the present invention.

FIG. 5 is a cross-sectional view of a memory device constructed as another embodiment of the present invention. The same reference numerals are used for elements identical to those depicted in FIGS. 2A through 2D, and detailed descriptions thereof will be skipped. The memory device of the present embodiment is almost identical to the memory device depicted in FIGS. 2A through 2D, but the memory device of the present embodiment further includes a vertically grown third nanowire 19. A voltage $V_3$ is applied to third nanowire 19 through gate electrode 16. Through third nanowire 19, a repulsive force can be more uniformly applied to second nanowire 18, making second nanowire 18 more easily deformed. Like first and second nanowires 17 and 18, third nanowire 19 can be made of a material such as a carbon group material, a platinum (Pt) group material, a silicon (Si) group material, a gallium nitride (GaN) group material, a gallium arsenide (GaAs) group material, or a zinc oxide (ZnO) group material. For example, third nanowire 19 can be a wire such as a carbon fiber wire, a carbon nanotube (CNT) wire, a platinum (Pt) wire, a silicon (Si) wire, a gallium nitride (GaN) wire, a gallium arsenide (GaAs) wire, or a zinc oxide (ZnO) wire.

FIGS. 6A through 6G show cross-sectional views illustrating a method of manufacturing a memory device according to principles of the present invention.

Figure 6A:
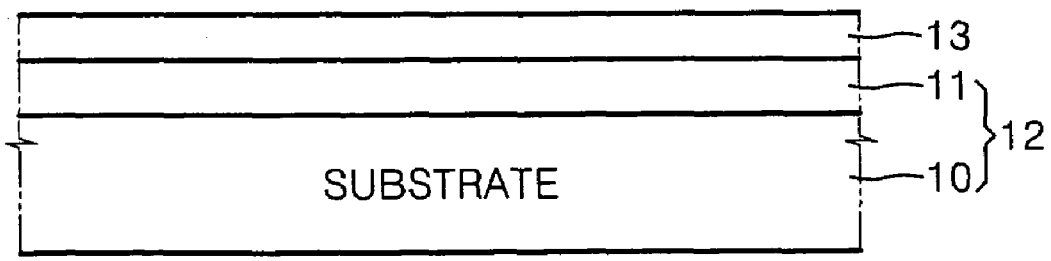
FIGS. 6A through 6G are cross-sectional views illustrating a method of manufacturing a memory device of the present invention.
Figure 6B:
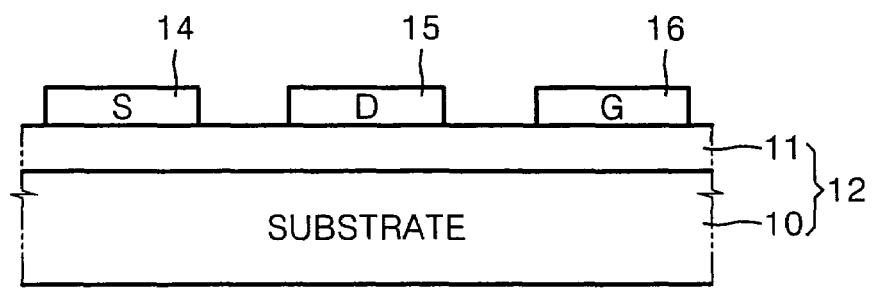

Referring to FIGS. 6A and 6B, insulating substrate 12 is prepared, and electrode layer 13 is formed on insulating substrate 12. Insulating substrate 12 includes silicon (Si) substrate 10 and silicon oxide ($SiO_2$) insulating layer 11 formed on Si substrate 10. Insulating substrate 12 can also be a glass substrate or a plastic substrate. Electrode layer 13 is made of a material such as niobium (Nb), chromium (Cr), molybdenum (Mo), tungsten (W), titanium (Ti), platinum (Pt), gold (Au), indium-tin-oxide (ITO), or silver (Ag). Source electrode 14, drain electrode 15, and gate electrode 16 are formed in a row on $SiO_2$ insulating layer 11 by patterning electrode layer 13.

Figure 6C:
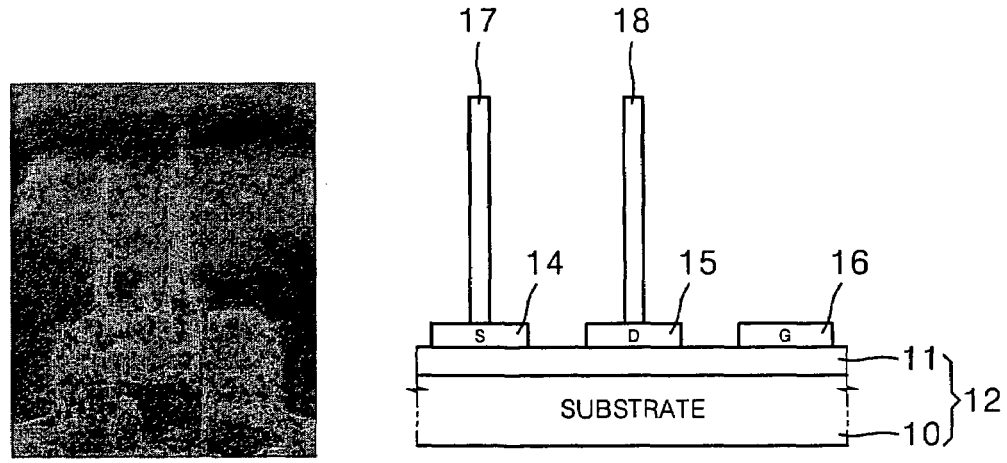

Referring to FIG. 6C, first nanowire 17 and second nanowire 18 are formed on source electrode 14 and drain electrode 15, respectively. Each of first and second nanowires 17 and 18 can be formed with a material such as a carbon group material, a platinum (Pt) group material, a silicon (Si) group material, a gallium nitride (GaN) group material, a gallium arsenide (GaAs) group material, or a zinc oxide (ZnO) group material. For example, each of first and second nanowires 17 and 18a can be a wire such as a carbon fiber wire, a carbon nanotube (CNT) wire, a platinum (Pt) wire, a silicon (Si) wire, a gallium nitride (GaN) wire, a gallium arsenide (GaAs) wire, or a zinc oxide (ZnO) wire. FIG. 6C also shows a scanning electron microscope (SEM) image of the nanowires. Each of first and second nanowires 17 and 18 has a diameter of 5 nm to 100 nm and a height of 1 μm to 4 μm.

Preferably, a catalyst material is deposited on source electrode 14 and drain electrode 15 to support the growing of first and second nanowires 17 and 18. The catalyst material can be a material such as nickel (Ni), invar, iron (Fe), cobalt (Co), or gold (Au).

Figure 6D:
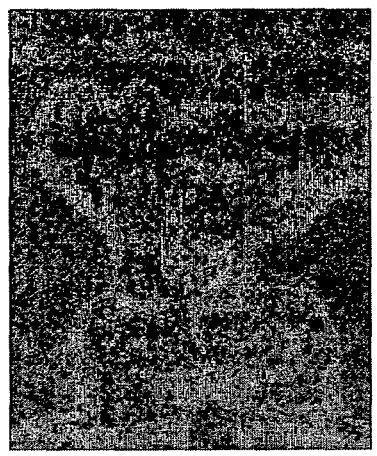
Figure 6D:
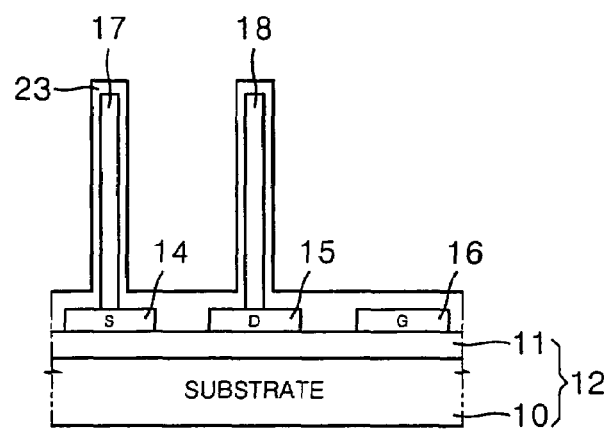

Referring to FIG. 6D, dielectric layer 23 having a thickness of 5 nm to 100 nm is formed on the outer surface of first nanowire 17. Dielectric layer 23 can be made of a material such as silicon nitride ($Si_3N_4$). Dielectric layer 23 can be formed by plasma enhanced chemical vapor deposition (PECVD) method. It is desirable to selectively form dielectric layer 23 only on the outer surface of first nanowire 17, but dielectric layer 23 also can be inevitably formed on source and drain electrodes 14 and 15 and on gate electrode 16, as depicted in FIG. 6D. However, dielectric layer 23 formed on the outer surface of second nanowire 18 can be removed through selective etching process. FIG. 6D shows a SEM image of the dielectric-coated nanowires.

Figure 6E:
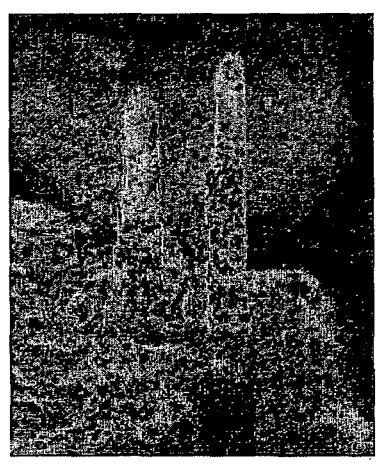
Figure 6E:
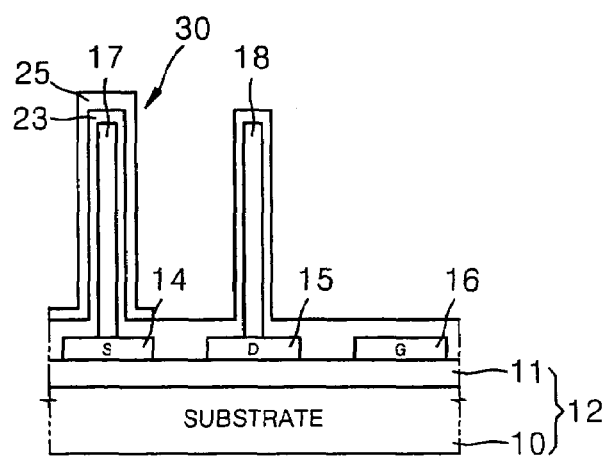

Referring to FIG. 6E, floating electrode 25 having a thickness of 5 nm to 100 nm is formed by selectively depositing a conductive material on dielectric layer 23 formed on the outer surface of first nanowire 17. Floating electrode 25 can be formed by thermal evaporation method using a material such as niobium (Nb), chromium (Cr), molybdenum (Mo), tungsten (W), titanium (Ti), platinum (Pt), gold (Au), indium-tin-oxide (ITO), or silver (Ag). Floating electrode 25 makes up a nanowire capacitor 30 together with dielectric layer 23 and first nanowire 17 formed on source electrode 14. FIG. 6E shows a SEM image of the first nanowire where a floating electrode is formed and the second nanowire where only dielectric layer is firmed.

Figure 6F:
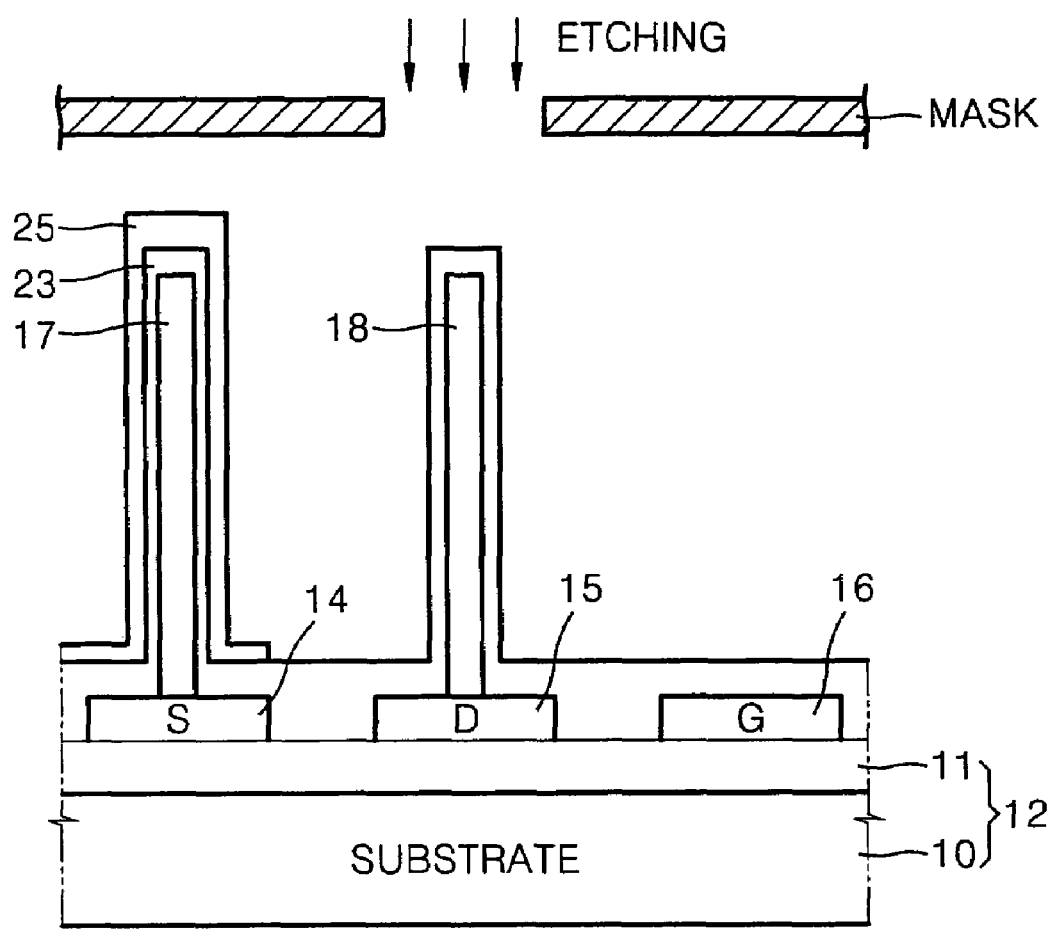
Figure 6G:
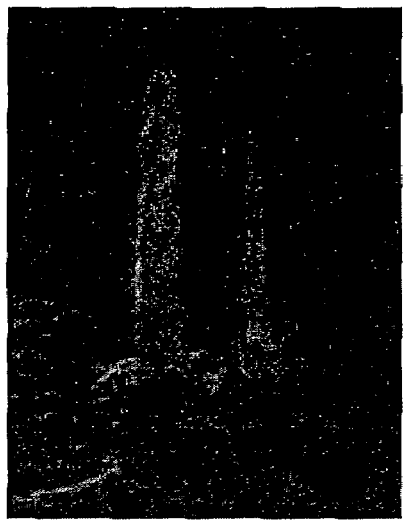
Figure 6G:
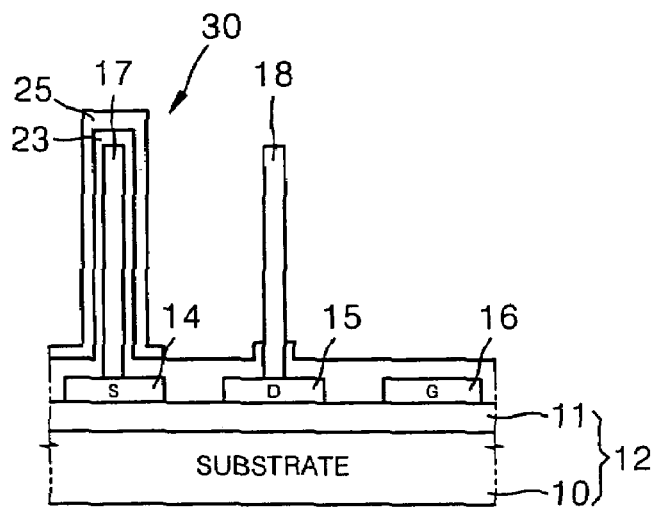

Referring to FIGS. 6F and 6G, dielectric layer 23 formed on the outer surface of second nanowire 18 is selectively etched to removed the dielectric layer and to expose the surface of second nanowire 18. Here, dielectric layer 23 formed on source and drain electrodes 14 and 15 can be used as a reinforcing member to support first and second nanowires 17 and 18. Through the processes described above, the memory device of an embodiment of the present invention can be obtained. FIG. 6G also shows a SEM image of the nanowire and nanowire capacitor of the completed memory device of the present invention.

EXAMPLE

An insulating substrate, i.e. a silicon/silicon oxide (Si/$SiO_2$) substrate was prepared, and an niobium (Nb) electrode layer was formed on the Si/$SiO_2$ substrate. Source, drain, and gate electrodes were formed by patterning the Nb electrode layer. A nickel (Ni) catalyst was deposited on the source and drain electrodes. Afterward, the substrate was heated to 550° C., and multi-wall carbon nanotubes (MWCNTs) were vertically grown on the source and drain electrodes to form first and second nanowires, respectively. Plasma enhanced chemical vapor deposition (PECVD) method with a gas mixture of acetylene ($C_2H_2$) and ammonia ($NH_3$) was used for the growth of the carbon nanotubes. The acetylene ($C_2H_2$) gas was injected into a chamber at a flow rate of 75 standard cubic-centimeters per minute (sccm). The MWCNT deposition was performed at a temperature of around 600° C., and a bias voltage of −600 V was applied to the electrodes formed on the silicon/silicon oxide (Si/$SiO_2$) substrate. The growth rate of the MWCNT was controlled to about 100 nm/min, and the chamber was maintained at a pressure of about 5.0 Torr. As a result, first and second MWCNT nanowires having diameters of 70 nm and heights of 1.6 μm were obtained. In order to manufacture a nanowire capacitor, a silicon nitride ($Si_3N_4$) dielectric layer having a thickness of 40 nm was deposited on the first and second MWCNT nanowires. The silicon nitride ($Si_3N_4$) dielectric layer was deposited by PECVD method using a gas mixture of silicon hydride ($SiH_4$) and ammonia ($NH_3$). Afterward, a nanowire capacitor structure was obtained by depositing a chromium (Cr) on the silicon nitride ($Si_3N_4$) dielectric layer of the first MWCNT nanowire by sputtering or thermal evaporation method to make a floating electrode. The silicon nitride ($Si_3N_4$) dielectric layer deposited on the outer surface of the second MWCNT nanowire was removed through a selective etching process. Through the processes described above, a memory device of an embodiment of the present invention was obtained.

According to the present invention, a memory device, which has a new structure and can replace DRAM devices, can be obtained. Particularly, the mechanical memory device of the present invention clearly distinguishes on and off states by a mechanical movement of a nanowire, and therefore has stable switching characteristics and minimal leakage current. Accordingly, the voltage for driving the memory device can be reduced, and a higher mobility can be realized than a conventional DRAM device. Also, the mechanical memory device of the present invention has a very simple structure allowing easy manufacture, and has a high manufacturing reproducibility, thereby providing high reliability.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A memory device comprising:
   an insulating substrate;
   a source electrode formed on the insulating substrate;
   a drain electrode formed on the insulating substrate and spaced apart from the source electrode;
   a nanowire capacitor formed on the source electrode, the nanowire capacitor including a first nanowire grown vertically from the source electrode, a dielectric layer formed on the outer surface of the first nanowire, and a floating electrode formed on the outer surface of the dielectric layer;
   a second nanowire grown vertically from the drain electrode, the second nanowire bending towards the nanowire capacitor while a voltage is applied to the drain electrode; and
   a gate electrode formed on the insulating substrate and spaced apart from the drain electrode, the drain electrode being arranged between the source electrode and the gate electrode.

2. The memory device of claim 1, comprised of the second nanowire contacting the nanowire capacitor, when a drain voltage is applied to the drain electrode and polarity of the drain voltage is opposite to polarity of a source voltage that is applied to the source electrode.

3. The memory device of claim 1, comprised of the second nanowire contacting the nanowire capacitor, when a drain voltage is applied to the drain electrode and polarity of the drain voltage is the same as polarity of a gate voltage that is applied to the gate electrode.

4. The memory device of claim 1, wherein each of the first and the second nanowires is made of a material selected from the group consisting of a carbon group material, a platinum group material, a silicon group material, a gallium nitride group material, a gallium arsenide group material, and a zinc oxide group material.

5. The memory device of claim 4, wherein each of the first and the second nanowires is a wire selected from the group consisting of a carbon fiber wire, a carbon nanotube wire, a platinum wire, a silicon wire, a gallium nitride wire, a gallium arsenide wire, and a zinc oxide wire.

6. The memory device of claim 1, wherein each of the source electrode, the drain electrode, the gate electrode, and the floating electrode is made of a material selected from the group consisting of niobium, chromium, molybdenum, tungsten, titanium, platinum, gold, indium-tin-oxide, and silver.

7. The memory device of claim 1, wherein each of the first and the second nanowires has a diameter of about 5 nano-meters to about 100 nano-meters.

8. The memory device of claim 1, wherein each of the first and the second nanowires has a height of about 1 micro-meter to about 4 micro-meters.

9. The memory device of claim 1, further comprising a third nanowire grown vertically from the gate electrode.

10. The memory device of claim 9, wherein the third nanowire is formed of a material selected from the group consisting of a carbon group material, a platinum group material, a silicon group material, a gallium nitride group material, a gallium arsenide group material, and a zinc oxide group material.

* * * * *